US006235456B1

(12) United States Patent
Ibok

(10) Patent No.: US 6,235,456 B1
(45) Date of Patent: May 22, 2001

(54) GRADED ANTI-REFLECTIVE BARRIER FILMS FOR ULTRA-FINE LITHOGRAPHY

(75) Inventor: Effiong E. Ibok, Sunnyvale, CA (US)

(73) Assignee: Advanced Micros Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/208,350

(22) Filed: Dec. 9, 1998

(51) Int. Cl.[7] .................................................... G03C 1/815
(52) U.S. Cl. ............................................ 430/512; 257/437
(58) Field of Search ............................. 430/512; 257/437

(56) References Cited

U.S. PATENT DOCUMENTS 5,641,607 * 6/1997 Ogawa et al. ....................... 430/512
5,698,352 * 12/1997 Ogawa et al. ....................... 430/512

OTHER PUBLICATIONS

Effiong Ibok, et al., *Material, Fractural, And Optical Properties of PECVD Silicon Nitride and Oxynitride Films*, Proceedings of the Thirteenth International Conference On Chemical Vapor Deposition, Proceedings vol. 96–5, pp. 470–477.

Efiong Ibok, et al., *Deposition, Material and Optical Properties of UV–Transmissive PECVD Silicon Nitride Films*, pp. 385–395.

* cited by examiner

*Primary Examiner*—Christopher G. Young
(74) *Attorney, Agent, or Firm*—Fliesler, Dubb, Meyer & Lovejoy

(57) ABSTRACT

This invention provides methods for manufacturing anti-reflective barrier and/or polish-stop layers on semiconductors. The anti-reflective barrier and/or polish-stop layers permit more accurate photolithography during the manufacture of semiconductor devices. The barrier and/or polish-stop layers can comprise nitride and/or oxynitride films having non-stoichiometric ratios of silicon to nitrogen atoms within the film structure. The non-stoichiometry permits the films to be semi-transparent, decreasing transmission of electromagnetic radiation through the layers, thereby decreasing the reflection of the electromagnetic radiation back through the photoresist layers. By decreasing the reflection of the electromagnetic radiation through the photoresist materials, the effects of diffraction by mask edges and standing wave interference can be reduced, thereby permitting the more accurate, reproducible inscription of patterns onto semiconductor devices. Further, by simple modifications of existing methods for depositing barrier and/or polish-stop layers, the production of the anti-reflective layers of this invention can be incorporated easily into the overall manufacturing process, thereby minimizing the additional costs and time require for semiconductor manufacture. The invention also includes semiconductor devices made using the anti-reflective materials disclosed.

19 Claims, 6 Drawing Sheets

GRADED ANTI-REFLECTIVE BARRIER FILMS FOR ULTRA-FINE LITHOGRAPHY

FIELD OF THE INVENTION

This invention relates to the manufacture of semiconductor devices as components of integrated circuits, specifically to processes for photolithography in which anti-reflective coatings are used to increase the accuracy of the photolithographic processing steps.

BACKGROUND OF THE INVENTION

I. Photolithography and Photoresists in Semiconductor Manufacturing

The size of integrated circuits is at least partially limited by the ability of the manufacturing methods to be carried out on a small scale. Many steps in the manufacture of integrated circuits can involve photolithography, in which patterns of features are produced in photoresist materials. Photoresist materials are sensitive to electromagnetic radiation, and upon development of the photoresist layer, portions of the photoresist layer are removed, by a process termed photolysis, revealing the underlying semiconductor material. Subsequent exposure of the underlying semiconductor material to etchants can result in the removal of the semiconductor material only where the photoresist layer had been photolyzed. Subsequently, the remaining regions of photoresist material are removed, leaving the un-etched areas of the semiconductor exposed for further processing.

II. Limitations of Feature Size Photolithography

The minimum size of a feature that can be manufactured on a semiconductor wafer is called a critical dimension, which can be limited by photolithography processes. For certain photolithography methods, it is desirable for the incident beam of electromagnetic radiation to penetrate into the photoresist layer in a direction perpendicular to the photoresist layer and the semiconductor wafer. Vertical orientation can provide desirable high resolution of photolithography, thereby minimizing critical dimensions. However, resolution of a photolithography step can be limited, for example, by diffraction of electromagnetic radiation by the edges of the mask and reflection of electromagnetic radiation by underlying layers. Collectively, there effects widen the area of photoresist exposed to electromagnetic radiation, a process termed herein "beam spreading." Nitride and oxynitride layers can amplify the problems inherent in photolithography, and thereby can limit the size of device features.

III. Diffraction, Reflection and Interference Effects in Photolithography

A. Diffraction

Diffraction of electromagnetic radiation by the edge of a mask ("edge effect diffraction") can displace the direction of incident electromagnetic radiation toward more lateral areas of photoresist which underlie the mask. Lateral displacement of the beam can expose undesired areas of photoresist, including areas of photoresist under the mask itself. Angular displacement of electromagnetic radiation is dependent on the wavelength of the radiation, with longer wavelengths being deflected by a larger angle than shorter wavelengths. This has led to the use of higher-energy, shorter wavelengths in photolithography.

Additionally, after angular displacement of a beam of electromagnetic radiation, the total lateral distance away from its intended path that a beam can travel is dependent on the thickness of the layers through which it passes. A thicker layer permits a greater lateral displacement of the beam. Therefore, another approach to decreasing the effect of diffraction is to decrease the thickness of the photoresist film. By decreasing the thickness of the film, there can be less opportunity for diffracted electromagnetic radiation to undercut the photoresist. However, as the photoresist film thickness is reduced, there can be increased variation in thickness of the photoresist layer, leading to errors in transfer of an image to the photoresist. Moreover, as the layer of photoresist becomes thinner, the transparency of the photoresist layer increases, thereby increasing reflection of electromagnetic radiation by underlying surfaces.

B. Interface Reflection

Interfaces between layers of materials can reflect incident electromagnetic radiation. Interfaces relevant to semiconductor manufacturing include, by way of example only, interfaces between silicon oxides and silicon. When a source-drain stack is manufactured using layers of oxide, stoichiometric nitride or oxynitride, and photoresist, the electromagnetic radiation can pass through the photoresist layer, the nitride or oxynitride, and the oxide, and can be reflected back upwards through the stack. Lateral reflection can cause absorption of electromagnetic radiation by photoresist underneath the mask edge, undercutting the mask edge and resulting in additional inaccuracies in the transfer of the mask image to the photoresist.

Where barrier or polish-stop layers underlie photoresists, they can add to the critical dimension problem. Polish-stop and barrier layers serve several purposes in manufacturing semiconductor devices. Polish-stop layers can be used when it is desired to provide a surface below which an etching or chemical mechanical polishing step will not remove substantial amounts of material. Barrier layers are commonly used in another type of isolation, termed the local oxidation of silicon (the "LOCOS") method. Barrier layers typically retard diffusion of contaminants into semiconductor structures.

Silicon nitride and silicon oxynitride are examples of materials commonly used to form barrier or polish-stop layers in photolithography processes. As used herein, the term "barrier layer" can refer to films that act either as diffusion barriers or as polish-stop layers. The chemical formula of silicon nitride is: $Si_3N_4$, and the formula for silicon oxynitride is: $Si_3N_4O_x$, where x can vary from less than about 1 to about 3. Silicon nitride films can be made using chemical vapor deposition (CVD), wherein precursors, by way of example only, $SiH_4$ and $NH_4$ are introduced into a deposition apparatus. A source of energy dissociates the precursors into reactive intermediates, which then can combine on the wafer surface to form the layer of nitride. Oxynitride films can be made by introducing $N_2O$ or NO into the reaction chamber. A desirable property of these materials for use as polish-stop layers include high mechanical strength, and a desirable property of these materials for use as barrier layers include high resistance to diffusion of contaminant molecules. These desirable properties of nitride and oxynitride are the greatest for stoichiometric films, that is, films in which the ratio of silicon to nitrogen is 3:4. However, conventional, stoichiometric nitride and oxynitride layers can provide problems in photolithography, including reflection and standing wave effects which make the manufacture of small, reproducible semiconductor device features difficult.

As manufacturing processes become more miniaturized, barrier and polish-stop layers become thinner. However, it is desirable to maintain desired mechanical and chemical properties of barrier and polish-stop layers. Low Pressure Chemical Vapor Deposited (LPCVD) silicon nitride layers can be made with these desirable qualities because nitride layers can be made which are thin and stoichiometric, thus comprising $Si_3N_4$. However, stoichiometric nitride layers can be transparent. In patterning using monochromatic electromagnetic radiation, transparency poses a limitation as the critical dimensions become smaller. Additionally, silicon oxide layers underlying the nitride layers also can be transparent. In contrast, interfaces between oxide and silicon substrate layers can reflect electromagnetic radiation, permitting the incident electromagnetic radiation to be reflected upwards back into the photoresist layer. Therefore, the incident path length of electromagnetic radiation from the top surface of the photoresist to the reflective layer can be larger for transparent barrier layers than for opaque layers. An increased incident path length permits greater lateral displacement of the beam. For each incremental increase in lateral displacement of the incident beam, there is a corresponding incremental increase in lateral displacement of the reflected beam.

Diffraction and reflection can occur together, thereby amplifying the defects. FIG. 1 is a drawing of a prior art semiconductor device during conventional photolithography, and depicts problems caused by diffraction and reflection at an interface. The substrate 104 has a layer of photoresist 110 on its surface, thereby forming reflective surface 112 between the layers. A mask 116 has an aperture defined by edges 120 through which electromagnetic radiation can penetrate into photoresist layer 110. Incident electromagnetic radiation 124 is diffracted laterally by edges 120. A portion of the diffracted electromagnetic radiation 124 is reflected from surface 112 laterally and passes upwards through photoresist layer 110, resulting in photolysis of the photoresist layer 110 to form a channel 128 having an uneven and non-parallel sidewall surfaces 132.

FIG. 2 is a drawing of a prior art semiconductor device during conventional photolithography with layers of source-drain oxide and stoichiometric barrier and/or polish-stop layers, and depicts the problems caused by diffraction and reflection. A layer of oxide 105 is deposited on the top of the substrate 104, and a nitride barrier layer 106 is deposited on top of oxide layer 105. A layer of photoresist 110 is deposited on the surface of nitride barrier layer 106. The oxide layer 105, nitride layer 106 and photoresist layer 110 are transparent, so that there is little reflection from surface 112. However, a reflective surface 112 is formed between the layers of oxide 105 and silicon substrate 104. A mask 116 overlays the top of photoresist layer 110, and mask 116 has an aperture defined by edges 120 through which electromagnetic radiation can pass. A monochromatic source of electromagnetic radiation produces a beam of incident electromagnetic radiation 124, which is diffracted laterally at edges 120. A portion of the beam of electromagnetic radiation 124 passes through nitride layer 106 and oxide layer 105 and is reflected by surface 112. The reflected electromagnetic radiation passes upwards through the photoresist layer 110, resulting in photolysis of the photoresist layer 110 to form a channel 128 having an uneven and non-parallel sidewall surfaces 132.

C. Interference Effects and Standing Waves

In addition to diffraction and lateral reflection, reflected and incident electromagnetic radiation can interfere with each other to produce standing waves in the photoresist materials. Standing waves provide higher energy to locations of interference maxima than to other areas. The difference in energies delivered to different locations within the photoresist layer can produce uneven photolysis, which results in a type of defect herein termed "scalloping." Additionally, standing waves can cause non-vertical resist profiles, variations in line width, reflective notching, scumming and alignment inaccuracies. Therefore, standing waves can be great enough to make it difficult to obtain repeatable patterns in the photoresist, particularly at the thicknesses used in source-drain masking FIG. 3 is a drawing depicting the formation of a standing wave within a layer of photoresist material 110 overlying a substrate 104 having a reflective surface 112 between the substrate and photoresist material. An incident beam of monochromatic electromagnetic radiation 125 strikes reflective surface 112 and is reflected back upwards as a reflected beam 126. As incident beam 125 and reflected beam 126 interact, an interference pattern is generated, resulting in a standing wave 127, having areas of interference maxima 130.

FIG. 4 is a drawing depicting the effect on photolysis of photoresist materials of the formation of a standing wave as in FIG. 3. As in FIG. 3, a semiconductor substrate 104 has a layer of photoresist material 110 deposited thereon in such a fashion as to produce a reflective surface 112 therebetween. As the photoresist material 110 is exposed to the beam of electromagnetic radiation, the standing wave (127 as in FIG. 3) photolyzes the photoresist material 110, resulting in the formation of a channel 128 having an uneven, scalloped edge 132 in channel 128 with large amplitude variations corresponding to interference maxima 130.

The aggregated effects of diffraction, reflection and standing waves can result in uneven and non-parallel sidewall surfaces. The production of these channel defects are herein termed "channel broadening."

To address the problems of channel broadening, several approaches can be used. One approach to minimize the problems of reflection is by increasing the absorption of electromagnetic radiation by the photoresist material. By increasing the absorption of electromagnetic radiation by the photoresist layer, less radiation can reach the underlying interface, and therefore, less reflection of the incident electromagnetic radiation occurs. Increasing absorption of electromagnetic radiation can be accomplished by the use of dye-containing photoresist layers or the use of thicker or multiple layers of photoresist materials.

IV. Anti-Reflective Coatings

In addition to altering the photoresist layers themselves, another approach involves using anti-reflective layers. Anti-reflective layers can absorb some of the incident radiation, diminishing the intensity of reflected radiation, and thereby reduce beam spreading and standing waves. Anti-reflective coatings can have advantages over thicker photoresist layers because thinner photoresist layers provide less opportunity for channel broadening due to misdirected electromagnetic radiation.

An example of a photolithography process involving a conventional anti-reflective coating is shown in FIG. 5. The semiconductor device 500 has a silicon substrate 104 having layers of oxide 105 and nitride 106 deposited thereon. Anti-reflective layer 107 is deposited on top of the nitride layer, and a photoresist layer 110 is deposited on top of anti-reflective layer 107. A mask 116 having an aperture defined by edges 120 overlays photoresist layer 110. A source of monochromatic electromagnetic radiation (not shown) produces an incident beam of radiation 124, which can pass through the aperture in mask 116. Incident beam 124 is diffracted laterally by edges 120. Incident beam 124 passes through photoresist layer 110 causing photolysis. Incident beam 124 does not penetrate the anti-reflective layer 107, the nitride layer 106, or the oxide layer 105.

However, there can be several problems associated with conventional anti-reflective layers. Deposition of anti-reflective layer 107 requires additional steps, materials and time, thereby decreasing manufacturing efficiency an increasing cost. Moreover, separate anti-reflective layers can generate relative mechanical stresses within the underlying semiconductor layers, which can lead to defects in the films, thereby decreasing photolithography resolution. Additionally, inorganic anti-reflective layers can alter the chemical reactions that occur in the photoresist layers, leading to a phenomenon termed "photoresist poisoning." Photoresist poisoning can result in a loss of sensitivity of the photoresist to the electromagnetic radiation, leading to incomplete photolysis, thereby producing a defect termed a "foot." A foot is an area of incompletely photolyzed photoresist material which narrows the channel in the photoresist. Photoresist poisoning is unpredictable and can therefore lead to poorly reproducible semiconductor feature sizes.

A method for decreasing photoresist poisoning includes treating the surface of the anti-reflective layer with an $O_2$ plasma. However, this process requires additional processing steps and can cause undesired oxidation of semiconductor materials. Thus the problems associated with reflection and standing waves have been inadequately addressed by the currently available methods of providing anti-reflective layers in photolithography.

Thus, in light of the above problems, one object of this invention is the development of methods for providing anti-reflective coatings which combine etch-stop and/or barrier functions for use in photolithography which are inexpensive to apply.

Another object of this invention is to develop methods for carefully controlling the optical properties of anti-reflective barrier and/or polish-stop layers during deposition.

A further object of this invention is to develop methods for providing anti-reflective barrier and/or polish-stop layers which can be easily incorporated into existing manufacturing methods.

Another object of this invention is to develop methods for providing reproducible and diminished reflected electromagnetic radiation defects during the use of monochromatic electromagnetic radiation for photolithography.

An additional object of this invention is to provide methods for photolithography in which small semiconductor device features can be made.

SUMMARY OF THE INVENTION

Thus, in one aspect of this invention comprises the use of polish-stop and barrier layers having optical properties controlled to create films with anti-reflective properties. Examples of the anti-reflective barrier and/or polish-stop layers are non-stoichiometric films comprising silicon nitride and silicon oxynitride. Non-stoichiometric films exhibit reduced transparency compared to stoichiometric films, thereby exhibiting decreased transparency to electromagnetic radiation. Anti-reflective nitride or oxynitride barrier or polish-stop layers can be produced using modifications of the methods used in the formation of shallow trench isolation (STI) and/or local oxidation of silicon (LOCOS) processes. Deposition of nitride and oxynitride layers typically involves the introduction of a silane and ammonia into a deposition chamber. However, the ratios of the reactant gases are controlled to provide the desired degree of non-stoichiometry. Typically, the ratio of $SiH_4$ to $NH_4$ in the reactant gas mixture is increased above that used for the manufacture of a stoichiometric film. By increasing the ratio of $SiH_4$ to $NH_4$ in the reaction chamber, the ratio of Si to N in the film increases, altering the crystal structure, resulting in a less transparent film. Moreover, because the stoichiometry can be adjusted during deposition by varying the relative amounts of reactant gases, it is possible to make graded, or "gradient" anti-reflective barrier layer and/or polish-stop layers having desired anti-reflective properties at selected positions throughout the thickness of the film, at the top, middle, or bottom of the polish-stop or barrier layer. Additionally, the anti-reflective barrier/polish-stop layers of this invention can be thinner than the total thickness of the separate barrier/polish-stop and anti-reflective layers of the prior art, thus enabling the closer spacing of semiconductor device features. Because the anti-reflective materials of this invention are manufactured using the same equipment and similar process conditions as the generally used stoichiometric films, the methods of manufacturing anti-reflective barrier layers of this invention can be integrated easily in the manufacturing processes with minimal disruption.

Thus, one aspect of this invention is a method for manufacturing an anti-reflective barrier layer comprising a non-stoichiometric nitride layer which combines barrier or polish-stop functions with anti-reflective functions in the same layer of material.

Another aspect of this invention is a method for manufacturing an anti-reflective layer comprising non-stoichiometric oxynitride.

A further aspect of this invention is a method for deposition of a graded non-stoichiometric nitride anti-reflective layer.

A yet further aspect of this invention is a method for deposition of a graded non-stoichiometric oxynitride anti-reflective layer.

Another aspect of this invention is a method for deposition of a mixed nitride-oxynitride anti-reflective layer.

An additional aspect of this invention is the manufacture of semiconductor devices having anti-reflective barrier and/or polish-stop layers.

Additional features of this invention can be understood by referring to the following description of the invention and the accompanying figures.

BRIEF DESCRIPTION OF THE FIGURES

The invention will be described with respect to the particular embodiments thereof. Other objects, features, and advantages of the invention will become apparent with reference to the specification and drawings in which:

FIG. 11A is a drawing depicting a channel in a semiconductor wafer made using an anti-reflective layer of the prior art.

DETAILED DESCRIPTION

Figure 1:
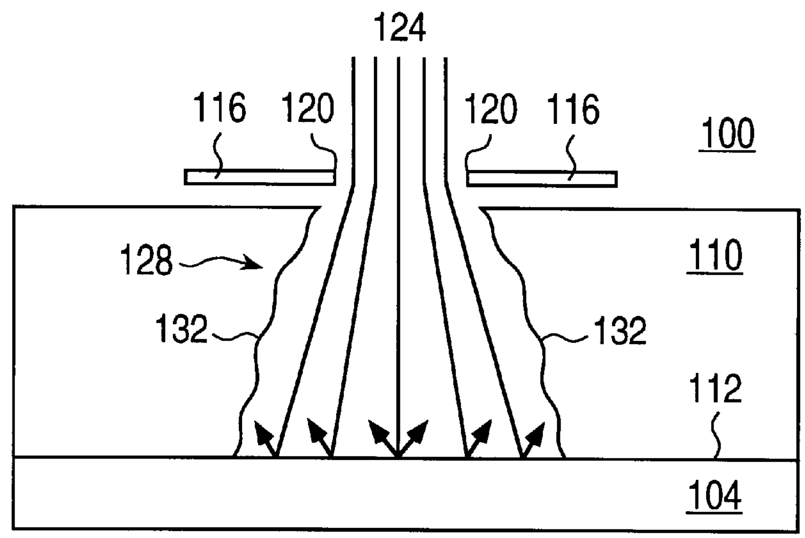
FIG. 1 is a drawing of a conventional semiconductor device during photolithography, showing effects of diffraction, reflection and beam spreading.
Figure 2:
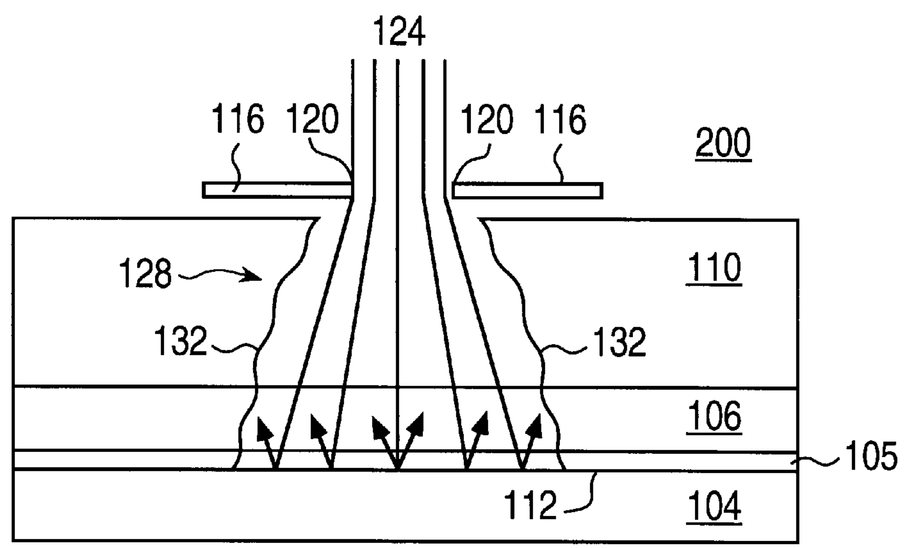
FIG. 2 is a drawing depicting the photolithography of a semiconductor device having conventional oxide and nitride layers, showing the effects of diffraction, reflection and beam spreading.
Figure 3:
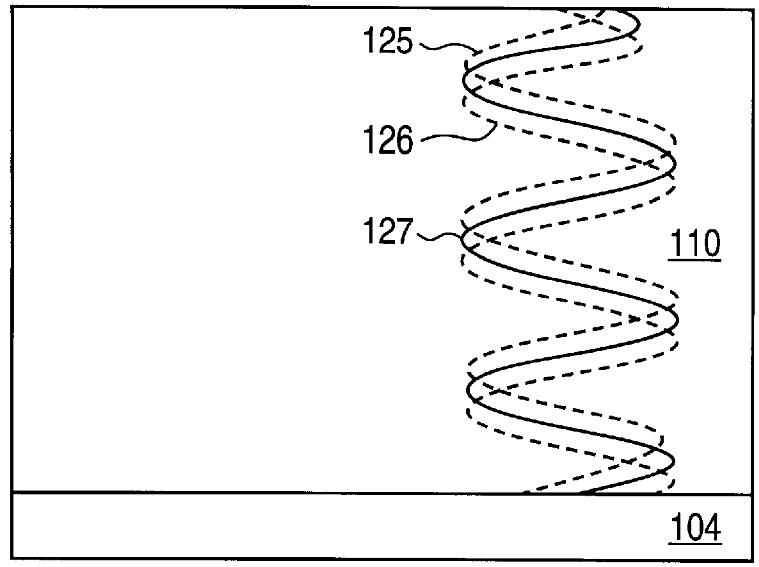
FIG. 3 is a drawing depicting the relationships between a beam of incident monochromatic electromagnetic radiation, reflected electromagnetic radiation and the standing wave which can result from the interference of incident and reflected waves

This invention provides an improved type of barrier and/or polish-stop layer having anti-reflective properties for increasing the accuracy and reproducibility of photolithography in the manufacture of semiconductor devices. As used herein, the term "anti-reflective layer" means either an anti-reflective barrier layer or an anti-reflective polish stop layer. In general, the invention involves the production of a barrier or polish-stop layer which is sufficiently opaque to the wavelengths of radiation used in photolithography to substantially decrease penetration of incident radiation through the layer and underlying oxide layer, if present. Thus, the anti-reflective and barrier and/or polish-stop functions are performed by the same layer, and therefore, the total thickness of the layer of this invention can be less than the thickness of the combined anti-reflective and barrier/polish-stop layers of the prior art. Therefore, defects which arise because of the relatively thicker layers can be decreased. Thus, the methods and layers of this invention provide more uniform, narrower features, thereby decreasing critical dimensions of semiconductor devices. The barrier and/or polish-stop anti-reflective layers need not be completely opaque, but rather, they need only be semitransparent.

By creating a semi-transparent barrier or polish-stop layer, there is no need to manufacture and remove separate anti-reflective coatings, and therefore, there is no need for additional time, reagents, equipment and cost. Thus, the efficiency of the manufacturing process can be maintained while providing the combined advantages of an anti-reflective layer and a barrier or polish-stop layer. To produce layers of this invention, it was unexpectedly discovered that by making nitride or oxynitride barrier and/or polish-stop layers non-stoichiometric, layers can be made having significantly reduced transparency without comprising the mechanical or chemical properties of the layers. Moreover, because the stoichiometry of the deposited layers can be closely regulated during manufacture, it is now possible to produce graded anti-reflective barrier layers having different optical, mechanical, and chemical properties in different parts of the layers.

I. Manufacturing Anti-Reflective Barrier and Polish-Stop Layers

In general, any type of transparent barrier or polish-stop layer that can be made semi-transparent is suitable as an effective anti-reflective barrier and/or polish-stop layer of this invention. By way of example only, films comprising silicon nitride and/or silicon oxynitride can be manufactured having anti-reflective properties, high mechanical resistance to polishing, and high resistance to diffusion of chemicals. Because the optical properties of silicon nitride and silicon oxynitride films can be easily regulated, these materials can be desirable as anti-reflective barrier and/or polish-stop layers. Generally, the thickness of the anti-reflective barrier layer should be sufficient to meet requirements for barrier layer and/or polish-stop layers. For applications in which relatively vigorous chemical mechanical polishing (CMP) is desired, a thicker anti-reflective polish-stop layer is desirable. However, for applications in which CMP can be more gentle, resulting is less polishing of the anti-reflective polish-stop layer, the thickness can be substantially thinner. Thus, the thickness can be in the range of about 600 Å to about 2500 Å, or alternatively about 1700 Å for typical CMP processes.

A. Nitride Anti-Reflective Barrier and Polish-Stop Layers

One aspect of this invention is the deposition of a nitride layer by LPCVD, typically carried out in a deposition chamber having a total pressure in the range of about 100 milliTorr (mTorr) to about 1000 mTorr, alternatively in the range of about 100 mTorr to about 500 mTorr. In another aspect of this invention, dissociation of precursors is carried out in a plasma enhanced CVD apparatus (PECVD).

1. Manufacture of Non-Stoichiometric Nitride Layers by Regulating Silicon:Nitrogen Ratio To manufacture anti-reflective/barrier/polish-stop layers of this aspect of the invention, one can vary ratios of silane and nitrogen-containing molecules as reactants in the LPCVD or PECVD process. In one embodiment of the invention, a film having a constant chemical composition throughout, a "unitary film", can be made by providing a constant, but greater flow of silane relative to the amount of $NH_3$ needed to make a stoichiometric film. For silane:ammonia ratio, R, of 1 and below, the UV transmittance is greater than about 90%, regardless of RF power ((Ibok, et al., *Deposition, Material and Optical Properties of UV-Transmissive PECVD Silicon Nitride Films*. Proceedings of the Third Symposium on Silicon Nitride and Silicon Dioxide Thin Insulation Films. Edited by Kapoor and Brown, Vol. 94/16:385–394 (1994), incorporated herein fully by reference). Increasing the silane:ammonia ratio progressively decreases UV transmittance at all RF power ranges, but especially at low RF power of 300 Watts–350 Watts per 6 inch diameter wafer. In fact, at a power of 300 Watts per 6 in diameter wafer (1.64 Watts/$cm^2$), a silane:ammonia ratio of about 1.3 can produce a nitride layer having about 10% UV transmittance or less. At a silane:ammonia ratio of about 2.0, the UV transmittance is less than about 20% for all RF power settings used (Ibok et al., Id.). Thus, to regulate the transmittance of the anti-reflective barrier layers of this invention, one can adjust the silane:ammonia ratio and/or the RF power supplied to the plasma generator.

In general, the maximum value of the silane:ammonia ratio is limited only by the maximum acceptable stress on the film. Two types of stress are of particular relevance to the films of this invention, compressive stress and tensile stress. Compressive stress is a stress in which the film tends to expand in a direction parallel to the surface of the film. Increasing the compressive stress can result in buckling of the surface and production of defects. One theory which may account for the formation of compressively stressed films is that addition of individual molecules to an existing surface can create more molecular misfits in the structure of the film. Tensile stress is a stress in which the film tends to contract in a direction parallel to the surface of the film. Tensile stresses can result in the formation of voids between deposited molecules in the film, leading to defects which can degrade the barrier function of a layer. Thus, it can be desirable to select an R value which produce stresses of less than about $3\times10^{10}$ dynes/cm$^2$. Stresses larger than about this value can cause undesirable defects in the film, and thereby degrade the effectiveness of the anti-reflective barrier layer. Alternatively, the range of stress can be in the range of about $10^{10}$ dynes/cm$^2$ compressive to about $10^{10}$ dynes/cm$^2$ tensile. In another embodiment, the range of stress can be from about $5\times10^9$ dynes/cm$^2$ compressive to about $5\times10^9$ dynes/cm$^2$ tensile. Methods for measuring stress of thin films is known in the art.

Table 1 shows comparisons of variables of deposition of conventional stoichiometric layers and the variables suitable for manufacture of a unitary anti-reflective barrier layers of this invention.

TABLE 1

Comparison of Process Variables in Manufacture of Source-Drain and Anti-Reflective (AR) Nitride Layers Using PECVD

| Process Variable | Source Drain Nitride | AR Nitride |
|---|---|---|
| $SiH_4$ Flow Rate (SCCM) | 150 | 200 |
| $N_2$ Flow Rate (SCCM) | 3000 | 3000 |
| $NH_3$ Flow Rate (SCCM) | 130 | 130 |
| Pressure (Torr) | 5 | 5 |
| RF Power (Watt/cm$^2$) | 1.85 | 1.77 |
| Temperature (° C.) | 400 | 400 |
| Gap (mils) | 550 | 550 |

According to Table 1, to manufacture a conventional nitride layer, "Source Drain Nitride", the flow rates in standard cubic centimeters per second (SCCM) of $SiH_4$ and $NH_4$ are adjusted as shown. Under these conditions, the resulting film has a stoichiometry of Si:N of 3:4, which produces a transparent film. In contrast, manufacture of a unitary anti-reflective barrier layer of this invention requires only an increase in the flow rate of the silicon-containing precursor, silane ($SiH_4$), while maintaining the nitrogen ($N_2$) and the ammonia ($NH_4$) flow rates constant. The increase in silane flow rate creates nitride films containing a ratio of Si to N of greater than 3:4. Thus, the non-stoichiometry of anti-reflective nitride films of this invention can be described as: $Si_{>3}N_4$. Non-stoichiometry of the layer decreases electromagnetic radiation transmission through the layer, and therefore decreases reflection by underlying layers. Thus, it is desirable to manufacture anti-reflective layers of this invention which have UV transmittance of about 25% or less compared to stoichiometric films having the same thickness. However, by manufacturing films having larger silane:ammonia ratios than shown in Table 1, the UV transmittance decreases further, and thinner films can be made which have less than 25% UV transmittance.

By decreasing the amount of reflected electromagnetic radiation, there is less opportunity for lateral diffraction and/or creation of standing waves within the photoresist material. Thus, there is less opportunity for formation of broader, uneven and/or scalloped edges of the channel in the photoresist layer. Moreover, progressively increasing the amount of silicon in the layer progressively decreases the transparency of the layer to electromagnetic radiation. The anti-reflective layers of this invention can permit the etching of narrower channels having sidewalls which are substantially parallel, and substantially reduces the problems associated with photoresist poisoning.

Although the mechanisms for the decreased UV transmittance of the films of this invention are not completely understood, according to one theory, increasing the ratio of silicon to nitrogen in a nitride film can add extra silicon atoms to the film, thereby creating defects of atomic dimensions, termed "misfits" in the crystal structure of the nitride layer. According to this theory, increasing the relative number of silicon atoms in the reaction gas mixture, more misfits can be made, thereby further decreasing the transparency of the resulting film. The creation of misfits in only one possible theory to account for the decreased transparency of films of this invention, and other theories may account for the observations.

Figure 5:
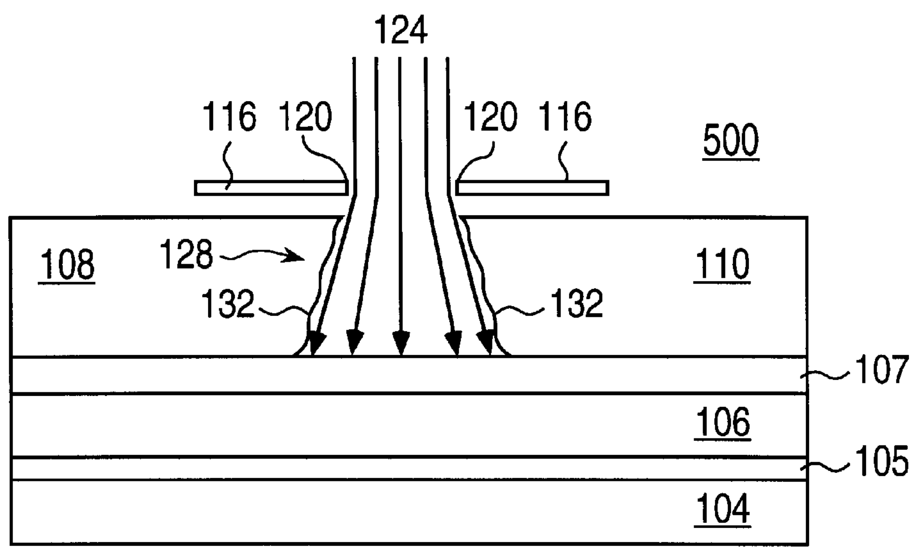
FIG. 5 is a drawing of the manufacture of a semiconductor device during photolithography of a semiconductor device incorporating a prior art anti-reflective layer.
Figure 6:
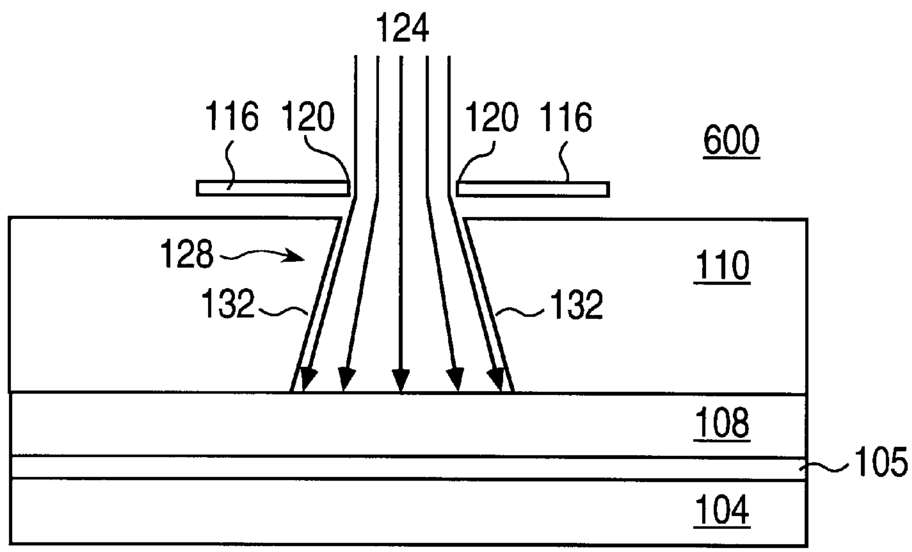
FIG. 6 is a drawing of a semiconductor device during photolithography using an anti-reflective barrier layer of this invention.

FIG. 6 is a drawing depicting the photolithography of a semiconductor having an anti-reflective barrier layer of this invention. The semiconductor device 600 has a silicon substrate 104 having a layer of oxide 105 deposited thereon. However, unlike the conventional anti-reflective layer of FIG. 5, the barrier layer of this invention 108 is made to be anti-reflective. Thus, barrier layer 106 and anti-reflective layer 107 of FIG. 5 are replaced by a single anti-reflective/barrier layer 108. Subsequently, a photoresist layer 110 is deposited on top of anti-reflective/barrier layer 108. A mask 116 having an aperture defined by edges 120 overlays photoresist layer 110. A source of monochromatic electromagnetic radiation (not shown) produces an incident beam of radiation 124, which can pass through the aperture in mask 116. Incident beam 124 is diffracted by mask edges 120, which spreads a portion of the beam laterally. The incident beam 124 passes through photoresist layer 110 causing photolysis. Incident beam 124 does not penetrate through the anti-reflective nitride layer 108 or the oxide layer 105 and therefore is not reflected back upwards into the photoresist layer 110 and consequent additional beam spreading are decreased.

Figure 4:
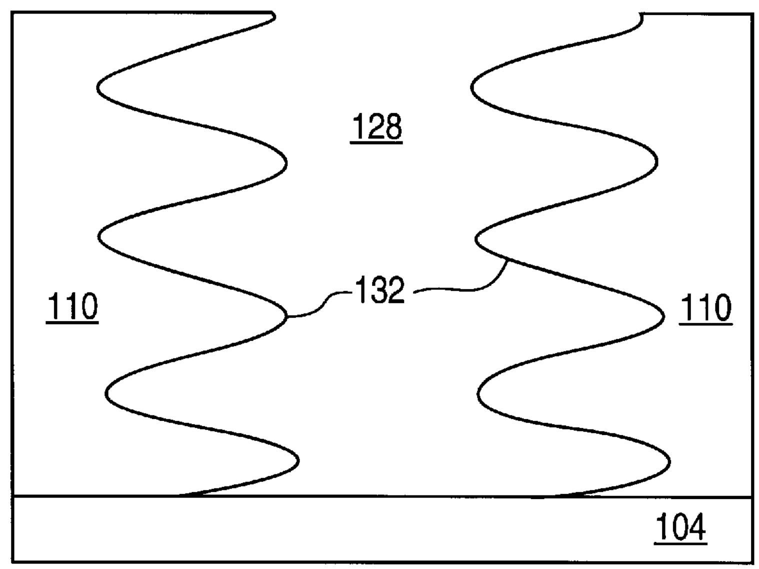
FIG. 4 is a drawing depicting scalloping of photoresist materials during conventional photolithography of a semiconductor photoresist layer due to the standing wave of electromagnetic radiation.
Figure 7:
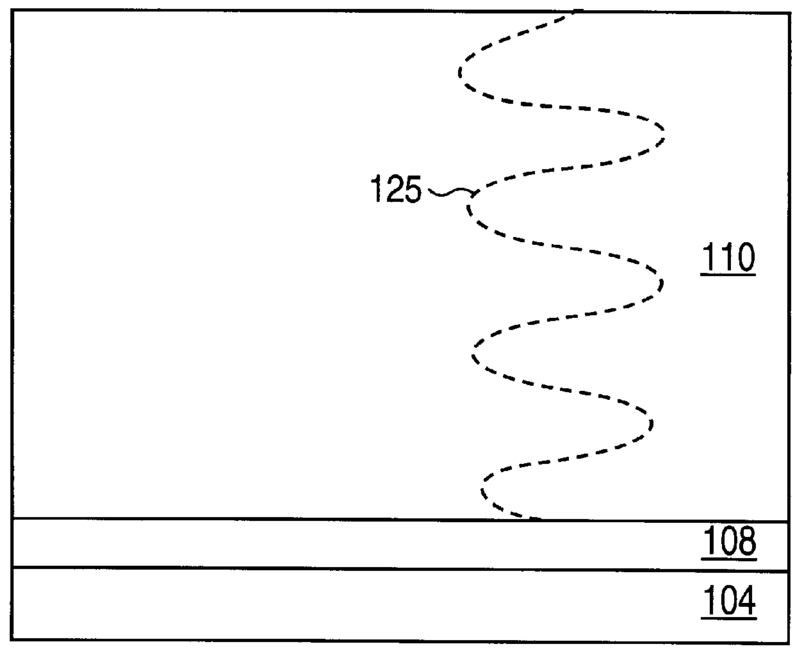
FIG. 7 is a drawing depicting a beam of monochromatic electromagnetic radiation passing through a layer of photoresist on a device incorporating an anti-reflective barrier layer of this invention.
Figure 8:
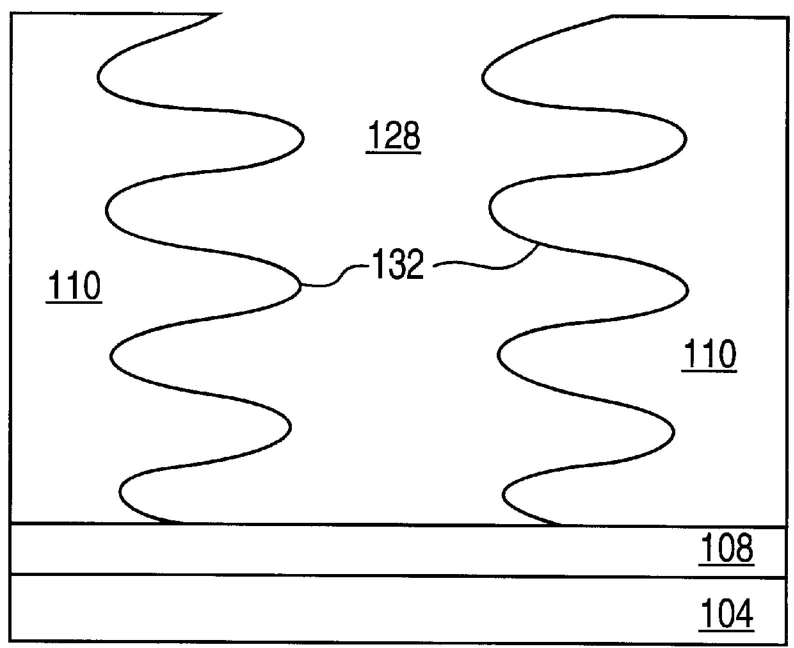
FIG. 8 is a drawing depicting the reduced scalloping of photoresist materials during photolithography of a semiconductor device having the anti-reflective barrier and/or polish-stop layer of this invention.

FIG. 7 is a drawing depicting the role of the anti-reflective barrier layer of this invention in inhibiting the formation of standing waves. A silicon substrate 104 has a layer of oxide 105 on top, forming a reflective surface 112 therebetween. On top of oxide layer 105, an anti-reflective barrier layer 108 is deposited, and a layer of photoresist 110 is deposited on top of anti-reflective barrier layer 108. A beam of incident electromagnetic radiation 125 is shown as in FIG. 5 penetrating into photoresist layer 110. However, anti-reflective barrier layer 108 does not permit the beam 125 to penetrate through to the reflective surface 112 and therefore no reflected wave exists. With no reflected wave being present, there can be no standing wave. FIG. 8 is a drawing of a semiconductor device after a photolithography step using an anti-reflective barrier layer of this invention. As in FIG. 7, a substrate layer 104 has an oxide layer 105 deposited thereon, thus forming a reflective layer 112 therebetween. Anti-reflective barrier layer 108 is deposited on the oxide layer 105 and a layer of photoresist material 110 is deposited on top of anti-reflective barrier layer 108. Exposure of photoresist material 110 to incident beam 125 of FIG. 7 results in the formation of a channel 128 in photoresist material 110. However, unlike the situation depicted in FIG. 4, the absence of a standing wave diminishes the width of the scalloped edge 132, thereby increasing the accuracy of the photolithography process.

The anti-reflective films of this invention have advantages over the prior art films. A typical prior art nitride barrier or polish-stop layer is about 1700 Å in thickness. A typical anti-reflective layer if the prior art is about 300 Å. Thus, the total thickness of the film is about 2000 Å. Thick films such as these exhibit large stresses which can lead to defects. In contrast with the thick films of the prior art, this invention can provide substantially thinner anti-reflective layers, which can have reduced stresses and reduced defects. Thinner films can be produced by decreasing the length of time for deposition, by decreasing the flow rates of precursors, or both. Using the methods of this invention, unitary anti-reflective barrier layers can be made having a thickness in the range of about 800 Å to about 2500 Å, alternatively about 1000 Å to about 2000 Å, and in another embodiment, about 1700 Å.

2. Regulating Film Properties By Controlling Radio Frequency Power

In addition to increasing the silane:ammonia ratio in the precursor gas flow, decreasing UV transmittance can also be accomplished by decreasing the RF power in a PECVD system. At higher RF power, there can be more rapid dissociation of precursors, which can result in the more rapid addition of molecules to the surface. However, increasing the radiofrequency (RF) power during the PECVD process carried out at a given silane concentration increases compressive stress on the film (Ibok et al., Id.). A possible theory to account for the observations is that with increasing RF power, the number of hydrogen atoms bonded to silicon can increase. Because hydrogen has a valence of one, a Si—H bond will terminate a chain of silicon atoms. Termination can create microvoids in the film, which can increase the volume of the film and can result in compressive stress in the film. However, other theories may account for the observations.

Thus, to counteract this tendency to form a compressive film, in another aspect of this invention, as the ratio of Si to N is increased to create non-stoichiometric films, decreasing the RF power and/or decreasing spacing between RF electrodes can decrease formation of reactive intermediates. By decreasing formation of reactive intermediates, fewer atoms can be added to the film's surface, resulting in decreased production of misfits. Additionally, reducing the RF power can decrease the amount of hydrogen in the film, thereby decreasing microvoids in the film. If the RF power is reduced too much however, the film can have a tensile stress. If the film has too much tensile stress, it can crack, leading to defects in the layer. Generally, to produce non-stoichiometric films of this invention, the RF power can be in the range of about 1 Watt/cm$^2$ to about 3 Watt/cm$^2$, or alternatively about 1.5 Watt/cm$^2$ to about 2 Watt/cm$^2$. It is within the art to determine, without undue experimentation, how to adjust RF power and/or electrode spacing to optimize the stress of the non-stoichiometric films of this invention.

B. Oxynitride and Mixed Nitride/Oxynitride Anti-Reflective Barrier and Polish-Stop Layers In another embodiment of this invention, the barrier or polish-stop layer is comprised of an oxynitride layer. An oxynitride layer is formed by adding $N_2O$ to the gas reactant mixture normally used to manufacture nitride films. Increasing the flow of $N_2O$ increases the proportion of oxynitride in the layer. However, as the $N_2O$ flow rate increases, the $NH_4$ flow can be decreased to maintain the total nitrogen content about constant, keeping the ration of Si to N about 3:4. Moreover, maintaining the total nitrogen content about constant and varying the amount of silane decreases the transparency of the oxynitride/nitride layer. The composition of the mixed barrier layer can be adjusted to suit particular needs. In general, the flow of $N_2O$ can be in the range of from about 40 to about 150 sccm. Correspondingly, the flow of $NH_4$ can be in the range of about 0 to about 110 sccm.

Thus, the anti-reflective barrier and/or polish-stop layers of this invention are made using similar process and equipment as the deposition of conventional barrier and polish-stop layers, making the incorporation of materials having anti-reflective properties into the manufacturing process very easy. No additional deposition steps are required, no additional equipment is needed, no additional precursors are needed, and no additional stripping steps are required. As a result, the total duration of the manufacturing process is not significantly affected, and the total thickness of the combined barrier/polish-stop/anti-reflective layer can remain low.

C. Graded Anti-Reflective Barrier and Polish-Stop Layers

One potential drawback of uniform, non-stoichiometric films is that they can exhibit decreased mechanical strength and/or reduced resistance to etchant chemicals compared to stoichiometric films. For applications in which mechanical or chemical stresses are not severe, uniform non-stoichiometric films can be suitable. However, for applications where large chemical and/or mechanical stresses are placed on the barrier or polish-stop layer, a manufacturer can be faced with a choice between sub-optimal alternatives: to select a strong, resistant transparent film having problems associated with reflection discussed above, or alternatively, to select an anti-reflective layer having decreased mechanical and/or chemical stability.

Therefore, in another embodiment of the invention, graded or "gradient" layers are manufactured, wherein, for example, one portion of the layer is stoichiometric, and another portion is non-stoichiometric. Thus, the gradient films provide advantages of both stoichiometric (high mechanical and chemical strength) and non-stoichiometric (anti-reflective) films. Two types of graded films are desirable, continuous gradient films and step gradient films. A continuous gradient film is a film in which the ratios of silicon:nitrogen differ in a continuous fashion throughout the thickness of the film. A step gradient film is a film in which the ratio of silicon:nitrogen changes abruptly with film thickness.

Continuous gradient anti-reflective barrier layers are made by progressively altering the ratio of silane to nitrogen in the reactant gas mixture. To manufacture one type of graded film, one can produce a stoichiometric barrier layer at the silicon or oxide surface, and then progressively increase the silane concentration to increase the opacity of the film, thereby making a graded film with progressively decreasing transparency as more film is deposited. This orientation produces a film having the least transparent portion at the top surface of the film. Alternatively, one can make a graded film with opposite orientation by first depositing a non-stoichiometric film having a high silane:ammonia ratio and then reducing the silane flow to produce a more stoichiometric film as the film is progressively deposited.

Moreover, if desired, one can produce a step gradient film by depositing a first layer of film having one silane:ammonia ratio followed by a different layer of film having a different silane:ammonia ratio. Further, it is possible to manufacture a graded film having a particular stoichiometry in the top, middle, and bottom portions of the film.

Figure 9:
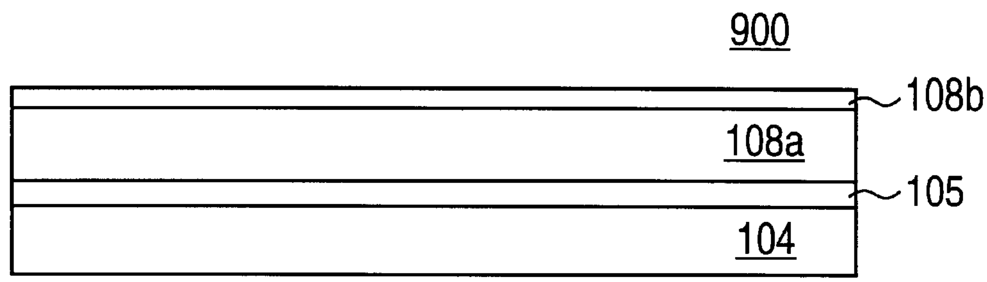
FIG. 9 is a drawing depicting a graded anti-reflective barrier layer of this invention.
Figure 10:
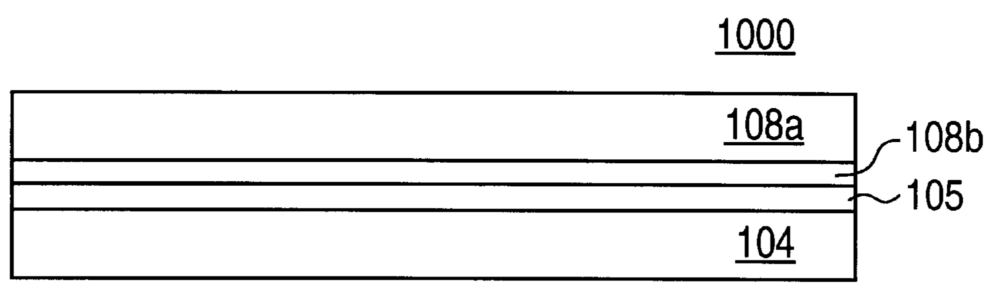
FIG. 10 is a drawing depicting a graded anti-reflective barrier layer of this invention having an orientation opposite to that of FIG. 9.

The desired orientation of the graded film can depend on the uses of the film in the manufacturing process. FIGS. 9 and 10 depict two aspects of step-graded films of this invention. By way of example only, it can be desirable to produce a graded polish-stop layer having the most effective polish-stop (e.g., stoichiometric) portion nearest the underlying oxide and/or silicon layers. The least transparent (i.e., non-stoichiometric) portion is on the uppermost side. FIG. 9 is a drawing depicting a semiconductor wafer 900 having a graded nitride film suitable for a polish-stop layer. The wafer 900 comprises a semiconductor substrate 104 having a layer of oxide 105, a relatively thick stoichiometric layer 108*a* made using a silane:ammonia ratio of about 1.15. On top of stoichiometric layer 108*a* is a relatively thin layer of non-stoichiometric nitride 108*b* having an R of about 1.54. This orientation provides the greatest mechanical resistance near the bottom of the film, nearest to the underlying silicon substrate, while also providing the desired anti-reflective properties.

Alternatively, it can be desirable to orient a step-graded barrier layer with the most effective barrier (i.e., a stoichiometric film) at the uppermost surface of the layer. FIG. 10 is a drawing depicting a graded nitride film having this orientation. Semiconductor wafer 1000 is comprised of a silicon substrate 104 having a layer of oxide 105, a relatively thin layer 108*b* of non-stoichiometric nitride film having an R of about 1.5, and a relatively thicker layer of stoichiometric nitride 108*a* having an R of about 1.15. This orientation provides the best diffusion barrier (i.e., the stoichiometric nitride portion) at the top of the film, where contaminants are in the highest concentrations. By minimizing the entrance of contaminants into the barrier layer, the diffusion of contaminants into the underlying oxide and/or silicon substrate layers is minimized. However, the transparency of the uppermost portion of the barrier layer need not cause problems because the lower portions of the barrier layer can be made non-stoichiometric to provide the desired anti-reflective properties.

As noted above, deposition of non-stoichiometric films can result in formation of compressive stress. Thus, to minimize stress in graded films, it can be desirable to decrease RF power as the silane flow rate is increased. Alternatively, it can be desirable to reduce the flow of $NH_4$ as the flow rate of $SiH_2$ is increased, thereby maintaining a constant total flow of precursors. By maintaining the total precursor flow constant, the deposition rates can remain about constant, thereby maintaining the stress within acceptable limits. Under these conditions, RF power need not be progressively diminished as the silane flow rate increases.

In alternate embodiments of this invention, mixed nitride/oxynitride layers can be deposited to provide the desired anti-reflective barrier layers while minimizing the stress on the film. By way of example only, an oxynitride layer deposited at the silicon substrate can reduce mechanical stress at the interface. Progressively increasing the nitride content of the subsequently deposited film can produce a film having graded stress and graded transparency.

Figure 11A:
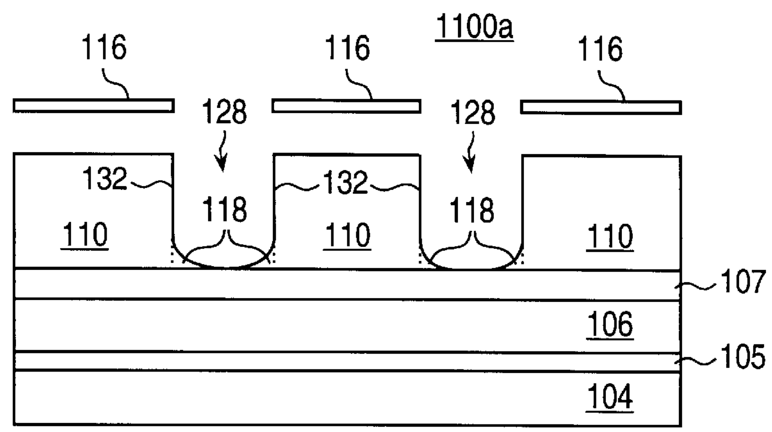
FIG. 11A is a drawing of a photoresist layer and an anti-reflective layer of the prior art depicting the presence of a foot in the photoresist layer due to photoresist poisoning by an anti-reflective layer of the prior art.

D. Anti-Reflective Layers of the Invention Decrease Photoresist Poisoning and Permit Narrower Channels One advantage of the graded anti-reflective barrier and/or polish-stop layers of this invention can be decreased thickness of a film having suitable anti-reflective properties compared to prior anti-reflective layers. Decreasing film thickness can permit the manufacture of narrower semiconductor features. A graded film can be made with a portion of the film having a silane:ammonia ratio R of about 2 or higher, and another portion having R of about 1.0. The portion having an R of about 1 is stoichiometric and strong, providing barrier and/or polish-stop properties, whereas the portion having an R of about 2 provides the UV absorption and anti-reflective properties of the film. By creating separate areas for these two functions of the layer, the total thickness of the layer can be reduced compared to a unitary, non-stoichiometric film. By way of example only, a film having a portion having an R of 2.0 can have a thickness as low as about 100 Å, and maintain desired anti-reflective properties, and a portion having an R of 1.5 can have a thickness as low as about 500 Å and maintain desired mechanical and/or chemical properties. Thus, the film has a total thickness of only 600 Å. FIGS. 11 and 12 illustrate this embodiment of this invention. FIG. 11A is a drawing depicting a prior art anti-reflective layer on a semiconductor wafer 1100*a* after exposure to electromagnetic radiation. The wafer 1100*a* has a silicon substrate 104 having a layer of oxide 105 on top, a nitride layer 106 deposited on oxide layer 105, a conventional anti-reflective layer 107 and a layer of photoresist 110 deposited on top of anti-reflective layer 107. A mask 116 overlays photoresist layer 110. Electromagnetic radiation (not shown) passes through the openings in mask 116, illuminating portions of photoresist 110. The electromagnetic radiation photolyzes exposed portions of photoresist 110, thereby creating channels 128 having sidewalls 132 in photoresist layer 110. Sidewalls 132 have feet 118 at the bottom portion of channels 128, thereby decreasing the width of the anti-reflective layer 107, and underlying nitride layer 106, oxide layer 105, and silicon substrate 104. Feet 118 have unpredictable and poorly reproducible dimensions, making the dimensions of subsequently etched layers unpredictable.

Figure 11B:
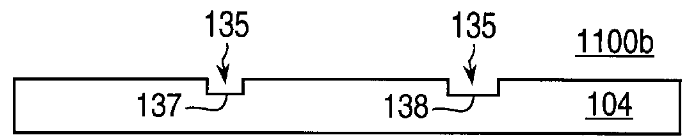

The photoresist poisoning reflected in the appearance of feet 118 carries through to the ultimate semiconductor manufacturing processes. FIG. 11B is a drawing depicting a semiconductor wafer 1100*b* corresponding to FIG. 11A. Wafer 1100*b* comprises a substrate 104 having etched channels 135. Channels 135 have widths which are variable, being width 137 for the left-hand channel, and width 138 for the right-hand channel.

Figure 12A:
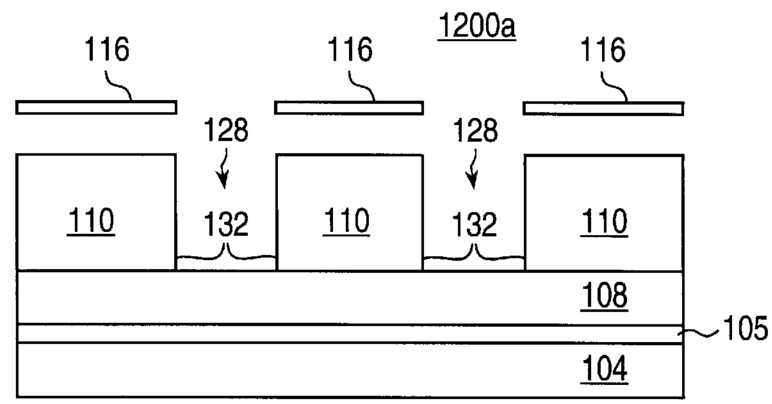
FIG. 12A is a drawing of a photoresist layer incorporating an anti-reflective barrier layer of this invention, depicting the absence of a foot in the photoresist layer.

FIG. 12A is a drawing depicting a semiconductor wafer 1200*a* having an anti-reflective barrier layer of this invention. Wafer 1200*a* is comprised of substrate 104 having a layer of oxide 105, an anti-reflective barrier layer 108 of this invention and a layer of photoresist 110. Mask 116 overlays photoresist layer 110. Electromagnetic radiation (not shown) passes through openings in mask 116, illuminating portions of photoresist 110. The electromagnetic radiation photolyzes exposed portions of photoresist 110, thereby creating channels 128 having sidewalls 132. In contrast to the sidewalls 132 of FIG. 11A, sidewalls 132 of the invention have no feet 118.

Figure 12B:
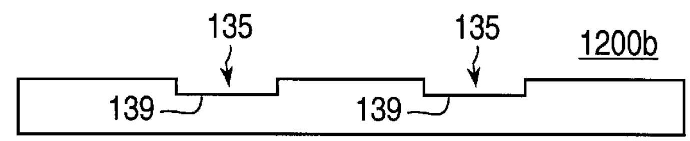
FIG. 12B is a drawing depicting a channel in a semiconductor wafer made using an anti-reflective barrier layer of the invention.

As a result of the more clearly defined photolysis possible using the anti-reflective barrier and/or polish-stop layers of this invention, one can manufacture semiconductor devices having smaller features than using methods of the prior art depicted in FIG. 11B. FIG. 12B is a drawing depicting a semiconductor wafer 1200*b* corresponding to FIG. 12A. Wafer 1200*b* comprises a substrate 104 with etched channels 135. Channels 135 have widths 139, which are the same as each other and are the same as the width of channel 128 in photoresist layer 110.

Thus, the use of anti-reflective barrier and/or polish-stop layers having such thinness permits the etching of narrow channels in the photoresist layer, as narrow as about 60–70 nm and up to about 1 μm in width. By manufacturing anti-reflective barrier layers even thinner than about 600 Å, even narrower channels can be inscribed. Moreover, by being able to manufacture reproducible, narrow features, the methods of this invention permit the manufacture of semiconductor devices having smaller feature sizes and increased device density.

II. Optical Properties of Anti-Reflective Barrier and Polish-Stop Layers

The absorbance of a film can be measured using several methods known in the art. Additionally, the anti-reflective properties of a thin film can be determined by measuring the interference patterns produced by incident electromagnetic radiation and electromagnetic radiation reflected from the underlying layers. Thus, one can determine the optical properties of the anti-reflective barrier and/or polish-stop layers of this invention in situ using methods known in the art. By way of example only, absorbance at 254 nm can be measured using a Hewlett-Packard UV Spectrophotometer. (Ibok, et al., *Deposition, Material and Optical Properties of UV-Transmissive PECVD Silicon Nitride Films*. Proceedings of the Third Symposium on Silicon Nitride and Silicon Dioxide Thin Insulation Films. The Electrochemical Society 94-16:385–394 (1994); Ibok, et al., *Material, Fractural and Optical Properties of PECVD Silicon Nitride and Oxynitride Films*. Electrochemical Society Proceedings 96-5:470–477 (1996), both references incorporated herein by reference). These methods are known in the art and will not be discussed further.

Additionally, the types of chemical bonds within the anti-reflective barrier and/or polish-stop layers of this invention can be determined using methods known in the art, including, by way of example only, Fourier Transformed Infrared Spectroscopy (FTIR) or X-ray photoelectron spectroscopy (XPS). These methods are known in the art and will not be discussed further. Because the types of bonds can provide information about the chemical composition of the film, the relative amounts of nitride and oxynitride and the relative non-stoichiometry of the films can be determined experimentally.

III. Removal of Anti-Reflective Layers

Once the photolithography steps have been accomplished, the anti-reflective barrier or polish-stop layers of this invention can be easily removed using conventional stripping methods. This can obviate the need for stripping steps to remove the anti-reflective layer and the barrier or polish-stop layers separately. Moreover, because the chemical properties of the non-stoichiometric barrier layers are similar to those of stoichiometric barrier layers, for certain applications the stripping methods need not be altered.

IV. Subsequent Manufacturing Processes

After the formation of either STI or LOCOS, depending on the type of isolation used, subsequent manufacturing of the semiconductor device can proceed using methods known in the art. Source-drain implantation, polysilicon layers, interlayer dielectric materials, metals, and other steps can be carried out to manufacture complete semiconductor devices. These processes are well known in the art and need not be describe further.

It is to be understood that the aforementioned description and examples are not intended to be limiting. Other embodiments of this invention are possible within the ordinary skill, and modifications of the described methods and films are within the ordinary skill of workers in the art, and all such modifications are considered to be part of this invention.

INDUSTRIAL APPLICABILITY

The anti-reflective barrier and/or polish-stop materials of this invention are suited for the manufacture of semiconductor devices having higher density of manufacture. The materials permit more accurate, reproducible photolithography during the initial steps of forming electrical isolation regions on semiconductor wafers. The methods employ novel variations of existing processing methods to provide barrier and/or polish-stop layers having anti-reflective properties without requiring the use of additional materials, equipment, or time. Thus, improved photolithography can be accomplished with a minimum of interference with existing manufacturing processes.

I claim:

1. A method for manufacturing a gradient anti-reflective film, said method comprising the steps of:

providing a semiconductor substrate;

depositing on said semiconductor substrate, a first layer of said anti-reflective film comprising at least one of a nitride film and an oxynitride film, said first layer having a first ratio of silicon to nitrogen atoms in said film; and depositing on said first layer, a second layer of said anti-reflective film comprising at least one of a nitride film and an oxynitride film having a second ratio of silicon to nitrogen atoms in said film, and wherein at least one of said layers has a non-stoichiometric ratio of silicon to nitrogen atoms.

2. The method of claim 1, wherein the ratio of silicon atoms to nitrogen atoms in at least one of said first and second layers are greater than about 3:4.

3. The method of claim 1, wherein at least one of said layers is made using an PECVD method using at least one of a pressure of about 5 Torr, a nitrogen flow rate of about 3000 sccm, a temperature of about 400° C., and a radiofrequency power in the range of about 1 Watt/cm$^2$ to about 3 Watt/cm$^2$.

4. The method of claim 3, wherein the radiofrequency power is decreased as the flow rate of the silicon precursor is increased.

5. The method of claim 1, wherein said gradient anti-reflective layer has an area of non-stoichiometry at the top surface of the film.

6. The method of claim 1, wherein said gradient anti-reflective layer is an anti-reflective polish-stop layer.

7. A gradient anti-reflective film comprising at least one non-stoichiometric nitride layer and at least one non-stoichiometric oxynitride layer and wherein the reflectivities of said nitride layer and said oxynitride layer are different.

8. The anti-reflective layer of claim 7 having a thickness of between about 600 Å and about 2500 Å.

9. The anti-reflective layer of claim 7, wherein the thickness of said at least one of said non-stoichiometric nitride and non-stoichiometric oxynitride film is at least about 100 Å.

10. The anti-reflective layer of claim 7, wherein the transmittance of said non-stoichiometric layer to ultraviolet light having a wavelength of 254 nm is less than about 25% of the transmittance of a stoichiometric film having the same thickness.

11. The anti-reflective layer of claim 7, wherein the stress of said anti-reflective layer is between about $3\times10^{10}$ dynes/cm$^2$ compressive and about $3\times10^{10}$ dynes/cm$^2$ tensile.

12. The anti-reflective layer of claim 7, wherein said gradient anti-reflective layer comprises a step gradient.

13. The anti-reflective layer of claim 7, wherein said gradient anti-reflective layer comprises a continuous gradient.

14. The anti-reflective layer of claim 7 having an area of non-stoichiometry at the bottom surface of the layer and an area of stoichiometry at the top of the layer.

15. The anti-reflective layer of claim 7 having an area of non-stoichiometry at the top surface of the layer and an area of stoichiometry at the bottom of the layer.

16. The anti-reflective layer of claim 7, wherein said anti-reflective layer has an area of non-stoichiometry within the interior of the layer.

17. The anti-reflective layer of claim 7, wherein said anti-reflective layer is at least one of a barrier layer and a polish-stop layer.

18. A semiconductor device made using an anti-reflective layer of claim 7.

19. The semiconductor device of claim 18, wherein said anti-reflective layer is at least one of a barrier layer and a polish-stop layer.

* * * * *